(12) United States Patent
Hatori

(10) Patent No.: US 6,867,057 B2
(45) Date of Patent: Mar. 15, 2005

(54) METHOD OF MANUFACTURING A SEMICONDUCTOR LASER

(75) Inventor: Nobuaki Hatori, Meguro (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/644,853

(22) Filed: Aug. 21, 2003

(65) Prior Publication Data

US 2004/0038440 A1 Feb. 26, 2004

(30) Foreign Application Priority Data

Aug. 23, 2002 (JP) ........................................ 2002-244090

(51) Int. Cl.[7] .............................................. H01L 21/00
(52) U.S. Cl. ........................................................ 438/29
(58) Field of Search .............................. 438/22, 29, 31, 438/46

(56) References Cited

U.S. PATENT DOCUMENTS

| | | | |
|---|---|---|---|
| 5,113,473 A | * | 5/1992 | Yoshida et al. ............. 385/131 |
| 6,596,555 B2 | * | 7/2003 | Bensahel et al. ............. 438/22 |
| 6,815,242 B2 | * | 11/2004 | Mukai et al. ................. 438/47 |

FOREIGN PATENT DOCUMENTS

| | | |
|---|---|---|
| JP | 5-251811 | 9/1993 |
| JP | 9-326506 | 12/1997 |
| JP | 2001-326421 | 11/2001 |

* cited by examiner

Primary Examiner—David Zarneke
Assistant Examiner—Scott B. Geyer
(74) Attorney, Agent, or Firm—Armstrong, Kratz, Quintos, Hanson & Brooks, LLP

(57) ABSTRACT

An AlGaAs cladding layer is formed on a GaAs semiconductor substrate, and then an i-type GaAs layer is formed thereon. Then, stripe-like grooves are formed in the GaAs layer by the photolithography method, and then an InAs layer is formed by the MBE method. At this time, edges of convex portions are deformed to be gentle with a rise of a substrate temperature, and thus flat portions are almost eliminated. Then, InAs is hardly deposited on slant surfaces of the convex portions and the InAs is grown on the bottom portions of the grooves in the S-K mode, so that InAs islands that are separated mutually are formed. Then, quantum dots are formed by covering the InAs islands with i-type GaAs. In this manner, a periodic structure of the quantum dots is formed by using the grooves.

14 Claims, 8 Drawing Sheets

METHOD OF MANUFACTURING A SEMICONDUCTOR LASER

CROSS-REFERENCE TO RELATED APPLICATIONS

This application is based upon and claims priority of Japanese Patent Application No. 2002-244090, filed on Aug. 23, 2002, the contents being incorporated herein by reference.

BACKGROUND OF THE INVENTION

1. Field of the Invention

The present invention relates to a method of manufacturing a semiconductor laser having a quantum dot structure in an active layer and, more particularly, a method of manufacturing a semiconductor laser suitable for a light source of the high-speed long-distance optical fiber communication or the access system optical fiber communication.

2. Description of the Prior Art

As the method of converting the electric signal into the optical signal, there are the direct modulation system for modulating directly the light being output from the semiconductor laser in response to change in the modulation signal, and the external modulation system for applying the modulation to the light being output from the semiconductor laser from the outside.

Normally, the external modulation system is employed in the large-capacity optical fiber communication system, and the transmitting device that generates the optical signal consists of the quantum-well distributed-feedback type semiconductor laser for generating the continuous light and the external optical modulator for superposing the signal onto the light that is output from the laser. Assume that the quantum-well distributed-feedback type semiconductor laser is operated at a high speed under the direct modulation, the refractive index of the active layer is varied due to variation in the injection carrier density since the structure used as the active layer of the semiconductor laser is the quantum well. Thus, such a phenomenon called the chirping that shift of the oscillation wavelength is caused to restrict the transmission distance is generated.

Therefore, as described above, the external modulation system is employed normally in the commercial large-capacity optical fiber communication system. The experiment of the very high-speed/large-capacity optical fiber communication, which is in excess of 10 Gbit/s, is being made by using combination of the continuously oscillating single-mode semiconductor laser and the high-speed optical modulator.

Meanwhile, as one of important parameters in the discussions of the chirping, there is a linewidth enhancement factor. The linewidth enhancement factor $\alpha$ is defined by a following expression (1).

$$\alpha = -\frac{\partial[\text{Re}\{\chi(N)\}]}{\partial N} \Big/ \frac{\partial[\text{Im}\{\chi(N)\}]}{\partial N} \quad (1)$$

where $\chi(N)$ is a complex susceptibility of the active layer, Re and Im are a real part and an imaginary part of $\chi(N)$ respectively, and N is a carrier density. If it is employed that the real part and the imaginary part of $\chi(N)$ are connected by the Kramers-Kronig relations and the imaginary part of $\chi(N)$ is proportional to a gain g, the expression (1) that defines the linewidth enhancement factor $\alpha$ can be expressed as a following expression (2).

$$\alpha(E, N) = -P \int_{-\infty}^{\infty} \frac{\partial g(E', N)/\partial N}{E' - E} dE' \Big/ \partial g(E', N)/\partial N \quad (2)$$

where E' and E are the energy respectively, and P is Cauchy principal value integral.

If the bulk structure is used as the active layer of the semiconductor laser, the linewidth enhancement factor has a value of about 4 to 6 in vicinity of the oscillation wavelength. The linewidth enhancement factor can be reduced up to about 2 by employing the quantum well structure as the active layer. It has been reported that, if the oscillation wavelength in the DFB (distributed feedback type) structure is shifted to the peak direction of the differential gain spectrum by adjusting material and composition of the quantum well and the laser structure, the linewidth enhancement factor can be reduced to a small value like 1.4 to 1.8. However, it is difficult to reduce much more this factor by using the quantum well structure. This is because, although such linewidth enhancement factor becomes 0 at the peak of the differential gain spectrum of the active layer, the peak position of the differential gain spectrum is normally placed in the absorption range of the gain spectrum in the quantum well structure and thus is displaced from the peak position of the gain spectrum.

As the semiconductor laser that is expected to reduce the linewidth enhancement factor much more than the quantum well structure semiconductor laser, the quantum-dot distributed-feedback type semiconductor laser having the quantum-dot structure in the active layer has been proposed.

FIG. 1 is a sectional view showing a structure of the quantum-dot distributed-feedback type semiconductor laser in the prior art.

An n-type AlGaAs cladding layer 12 is formed on an n-type GaAs semiconductor substrate 11, and then an i-type GaAs SCH (Separate Confinement Heterostructure) layer 13 is formed on the n-type AlGaAs cladding layer 12. An area in which quantum dots 14 are arranged in the three-dimensional direction and an area in which the quantum dots 14 are not formed are provided at a constant period alternatively in the GaAs SCH layer 13. This i-type GaAs SCH layer 13 constitutes the active layer of the semiconductor laser.

A p-type AlGaAs cladding layer 15 is formed on the GaAs SCH layer 13, and then a p-type GaAs cap layer 16 is formed on the AlGaAs cladding layer 15.

Electrode 17a, 17b are formed under the GaAs semiconductor substrate 11 and on the GaAs cap layer 16 respectively. Also, a high reflectance mirror 18 is formed on one end surface side of the GaAs SCH layer 13, and also a low reflectance mirror 19 is formed on the other end surface side of the GaAs SCH layer 13. The light is emitted through the low reflectance mirror 19.

Normally the quantum dots are formed in the strain system heteroepitaxial structure such as InAs/GaAs, or the like by utilizing the S-K (Stranski-Krastanov) mode growth that appears in the initial stage of the heteroepitaxial growth (for example, see Patent Application Publication (KOKAI) Hei 9-326506).

Next, a method of manufacturing the quantum-dot distributed-feedback type semiconductor laser in the prior art will be explained with reference to FIG. 1 and FIGS. 2A to 2G hereinafter.

First, as shown in FIG. 2A, the n-type AlGaAs cladding layer 12 of about 1400 nm thickness is formed on a (100) face of the n-type GaAs semiconductor substrate 11 by the MOVPE (Metal Organic Vapor Phase Epitaxy) method of the MBE (Molecular Beam Epitaxy) method. Then, an i-type GaAs layer 21 of about 20 nm thickness is formed on the AlGaAs cladding layer 12 by supplying TEGa (triethylgallium) and $AsH_3$ (arsine) to the chamber. At this time, the substrate temperature is set to 620° C., for example.

Then, as shown in FIG. 2B, supply of Ga is shut off and then the substrate temperature is lowered to about 500° C. Then, an i-type InAs layer having a thickness that corresponds to one to several molecular layers is deposited by introducing the molecular beam of In into the chamber. At this time, the lattice constant of the InAs layer is slightly different from the lattice constant of the GaAs layer 21. Therefore, as shown in FIG. 2C, a large number of InAs islands 22 that are separated mutually are generated on the GaAs layer 21 by the S-K mode growth.

After the first-layer InAs islands 22 are formed In this manner, as shown in FIG. 2D, an intermediate layer 23 made of i-type GaAs and having a thickness of 2 to 3 nm is deposited on the GaAs layer 21. Thus, the InAs islands 22 are surrounded by the GaAs that has a large band gap, so that quantum dots 14 that confine the carrier three-dimensionally are formed.

Then, the formation of the InAs islands 22 and the deposition of the i-type GaAs intermediate layer 23 are repeated several times. Thus, as shown in FIG. 2E, a layer 24 having a layered quantum-dot structure in which the quantum dots 14 are arranged three-dimensionally is formed.

Then, as shown in FIG. 2F, stripe-like grooves 25 that reach the AlGaAs cladding layer 12 are formed by etching the layer 24 by virtue of the photolithography method. Then, as shown in FIG. 2G, an i-type GaAs layer is deposited on the overall surface to bury the grooves 25, so that a surface of the GaAs layer is planarized. In this manner, the GaAs SCH layer 13 is formed. An area in which the quantum dots 14 are arranged in the three-dimensional direction and an area in which the quantum dots 14 are not formed are provided at a constant period alternatively in the GaAs SCH layer 13.

Then, as shown in FIG. 1, the p-type AlGaAs cladding layer 15 and the p-type GaAs cap layer 16 are formed sequentially on the GaAs SCH layer 13. Then, the electrodes 17a, 17b and the high reflectance mirror 18 and the low reflectance mirror 19 are formed. As a result, the quantum-dot distributed-feedback type semiconductor laser is completed.

As described above, in the large-capacity optical fiber communication system, normally the transmitter is constructed by integrating the semiconductor laser and the optical modulator. However, there is such a drawback that a configuration of this system is complicated rather than the direct modulation of the semiconductor laser single body, and thus a production cost is increased.

The semiconductor laser having the quantum-dot structure has such advantages that the linewidth enhancement factor is small rather than the semiconductor laser having the quantum-well structure and also the chirping is difficult to occur even when the direct modulation is applied. However, in order to utilize the semiconductor laser in the very high-speed/large-capacity optical fiber communication system, the semiconductor laser in which the quantum dots can be formed uniformly at a higher density and which can have a larger gain is desired.

SUMMARY OF THE INVENTION

From the above, it is an object of the present invention to provide a method of manufacturing a semiconductor laser in which quantum dots can be formed uniformly at a high density, which can have a large gain, and in which a chirping is hard to occur even when the direct modulation is applied thereto.

The above subject can be overcome by providing a method of manufacturing a semiconductor laser that comprises the steps of forming a semiconductor layer on a substrate; forming periodic concave and convex portions on the semiconductor layer; deforming flat surfaces of the convex portions in the semiconductor layer into slant surfaces that are inclined toward bottom portions of the concave portions; and forming an active layer in which quantum dots are arranged three-dimensionally only on insides of the concave portions.

Also, the above subject can be overcome by providing a method of manufacturing a semiconductor laser that comprises the steps of forming a first layer made of a first semiconductor layer on a substrate; forming periodic stripe-like grooves on the first layer; deforming flat surfaces of the first layer between the grooves into slant surfaces that are inclined toward bottom portions of the grooves, by heating the first layer together with the substrate; and forming quantum dots only on the bottom portions of the grooves by utilizing a difference between lattice constants, by depositing a second semiconductor on insides of the grooves.

In the present invention, the periodic concave and convex portions (or the grooves) are formed on the semiconductor layer made of the first semiconductor. The period of the concave and convex portions is set to the same extent as the positive-integral multiple of ½ of the wavelength of quantum dots in the waveguide, for example.

Then, the flat surfaces in the convex portions are deformed into the slant surfaces that are inclined toward the bottom portions of the concave portions. For example, if a width of the convex portion is set sufficiently small, a sectional shape of the convex portion becomes gentle in the course of the substrate temperature rise, so that the flat surface of the convex portion can be eliminated.

Then, the second semiconductor is deposited on the semiconductor layer by the molecular beam epitaxy method, for example. In this case, the second semiconductor is seldom deposited on the slant surfaces of the convex portions and is deposited mainly on the bottom portions of the concave portions. The second semiconductor is grown in the S-K mode on the bottom portions of the concave portions, and thus the quantum dots are formed.

In this fashion, in the present invention, since the quantum dots are self-formed only on the bottom portions of the concave portions (or the grooves), the quantum dots can be formed uniformly at a high density. As a result, it is possible to manufacture the semiconductor laser which can have a large gain and in which the chirping is difficult to occur even when the direct modulation is applied thereto.

DESCRIPTION OF THE PREFERRED EMBODIMENTS

Embodiments of the present invention will be explained with reference to the accompanying drawings hereinafter.

(First Embodiment)

FIGS. 3A to 3J are views showing a method of manufacturing a quantum-dot distributed-feedback type semiconductor laser according to a first embodiment of the present invention.

Figure 1:
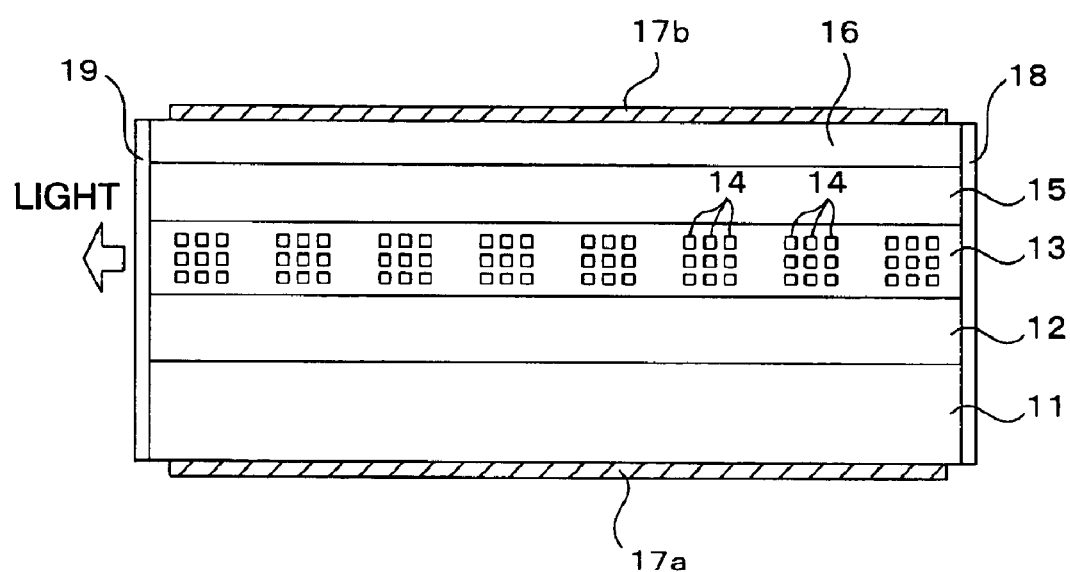
FIG. 1 is a sectional view showing a structure of a quantum-dot distributed-feedback type semiconductor laser in the prior art.
Figure 2A:
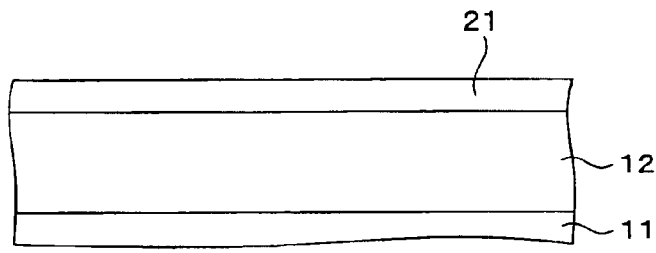
FIGS. 2A to 2G are views explaining a method of manufacturing a quantum-dot distributed-feedback type semiconductor laser in the prior art.
Figure 2B:
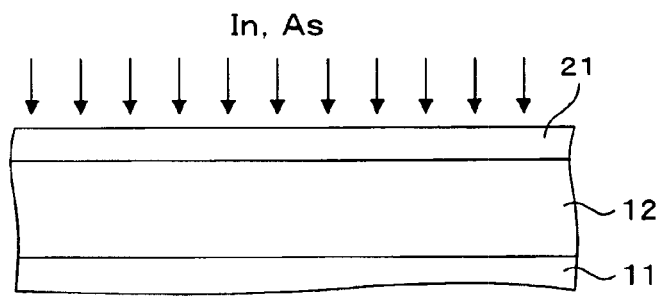
Figure 2C:
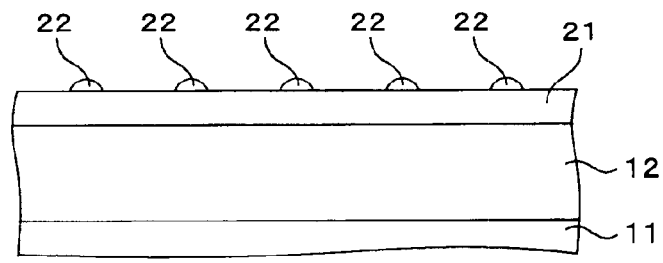
Figure 2D:
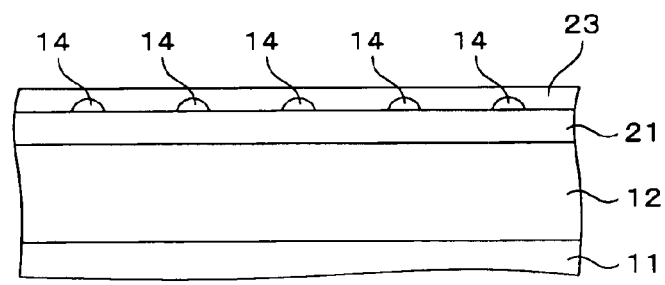
Figure 2E:
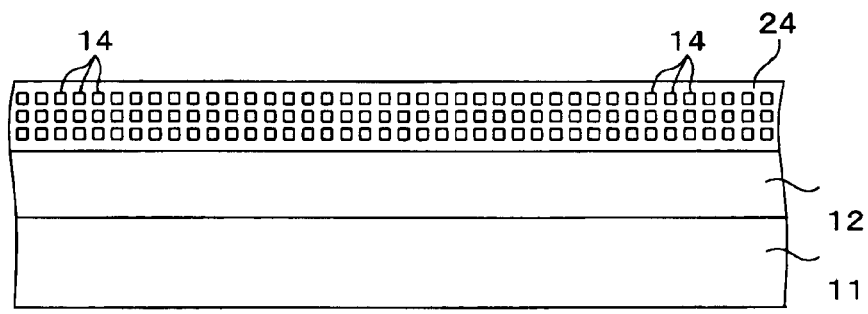
Figure 2F:
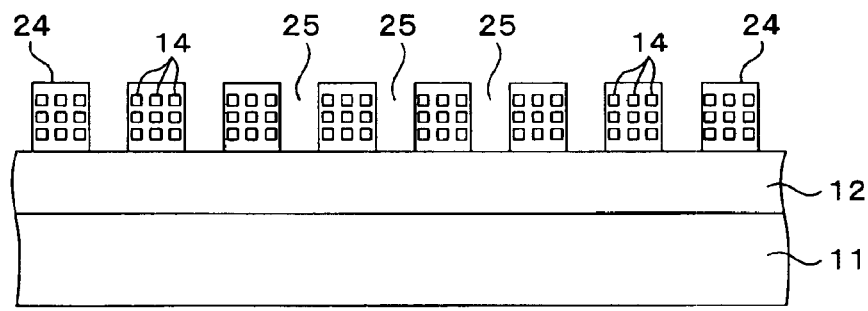
Figure 2G:
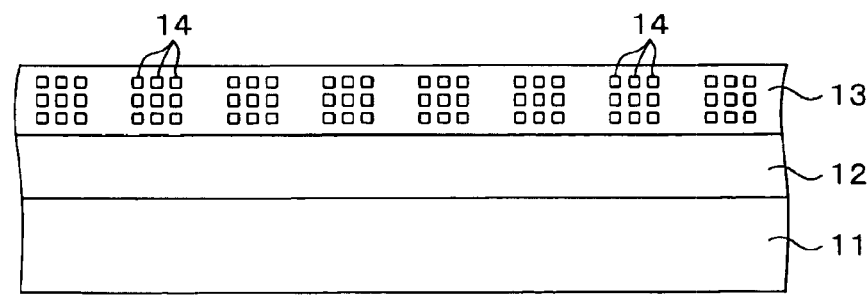
Figure 3A:
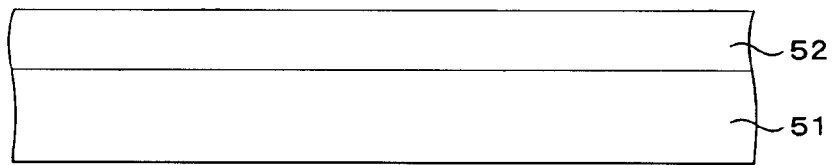
FIGS. 3A to 3J are views showing a method of manufacturing a quantum-dot distributed-feedback type semiconductor laser according to a first embodiment of the present invention.

First, as shown in FIG. 3A, a cladding layer 52 made of n-type $Al_{0.4}Ga_{0.6}As$ is formed on a (100) face of an n-type GaAs semiconductor substrate 51 by the MBE method to have a thickness of about 1400 nm. At this time, the substrate temperature is set to 620° C., for example. Here, an InGaAs semiconductor substrate or an InP semiconductor substrate may be employed in place of the GaAs semiconductor substrate.

Figure 3B:
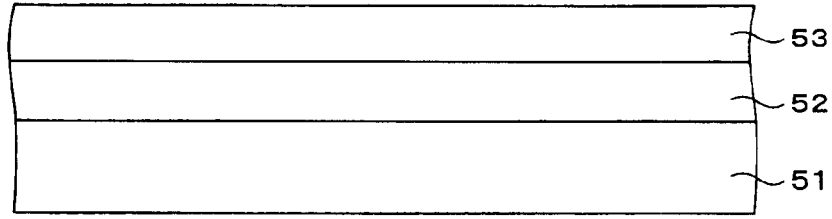

Then, as shown in FIG. 3B, an i-type GaAs layer 53 of about 600 nm thickness is formed on the n-type AlGaAs cladding layer 52 by supplying TEGa (triethylgallium) and $AsH_3$ (arsine) to the chamber.

Then, the semiconductor substrate 51 is taken out of the chamber of the MBE equipment. Then, photoresist is coated on a surface of the i-type GaAs layer 53. Then, a diffraction pattern is drawn on the photoresist by the electron beam exposure, and then the developing process is applied to the photoresist. Thus, stripe-like resist masks (not shown) each having a width of about 50 nm are formed to have a predetermined pitch.

Figure 3C:
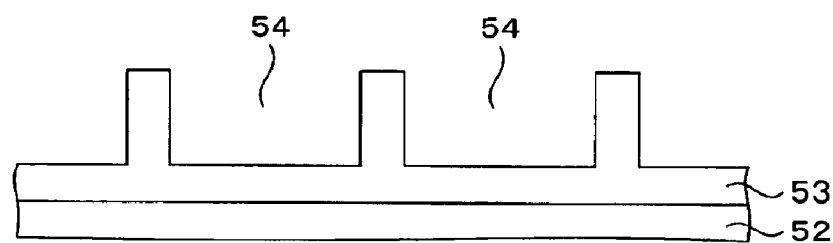

Then, as shown in FIG. 3C, grooves 54 having a depth of about 400 nm are formed by applying the dry etching to portions, which are not covered with the resist masks, of the i-type GaAs layer 53. In this case, since the etching proceeds in the direction perpendicular to the substrate 51 in the dry etching, cross sections of the grooves 54 become almost a rectangle and areas between the grooves (called "terraces" hereinafter) become flat, as shown in FIG. 3C.

In this case, a pitch of the grooves 54 is set according to the oscillation wavelength. In the present embodiment, since a periodic structure is constructed by forming the quantum dots in each groove 54 as described later, the pitch of the grooves 54 is decided such that the periodic structure of the quantum dots is set to the same extent as the positive-integral multiple of ½ of the wavelength in the waveguide. For example, the pitch of the grooves 54 is decided as 200 nm if the oscillation wavelength is set to 1.3 μm, while the pitch of the grooves 54 is decided as 240 nm if the oscillation wavelength is set to 1.55 μm. In this case, the oscillation wavelength depends on not only the period of the quantum dots but also composition and size of the quantum dots.

Figure 3D:
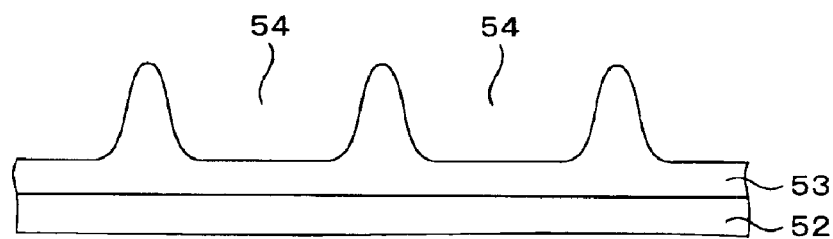

Then, the substrate 51 is loaded again into the chamber of the MBE equipment, and then is heated up to about 500° C. Thus, as shown in FIG. 3D, edge portions of the grooves 54 become gentle curved surfaces and thus flat portions of the terraces are almost eliminated.

Figure 3E:
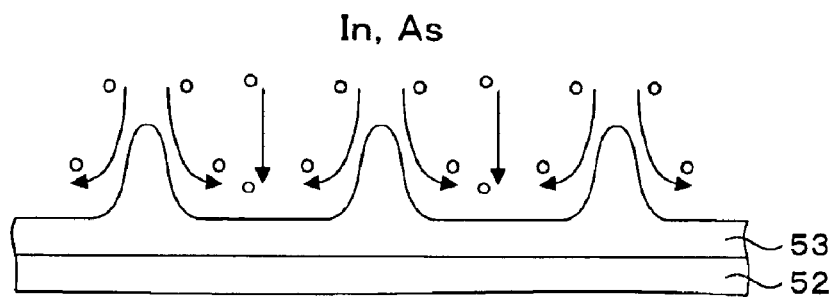
Figure 3F:
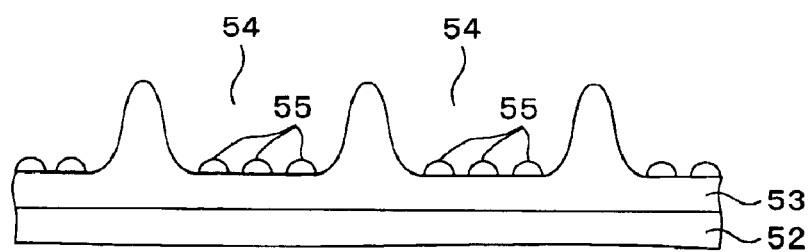

Then, as shown in FIG. 3E, the i-type InAs layer is formed by introducing the In and As molecular beams into the chamber. At this time, the InAs molecules are hardly deposited on slant surfaces of convex portions and are deposited on bottom portions of the grooves 54. Then, as shown in FIG. 3F, a large number of InAs islands 55 that are separated mutually appear by the S-K mode growth when the i-type InAs layer is deposited on the bottom portions of the grooves 54 to some extent.

Figure 3G:
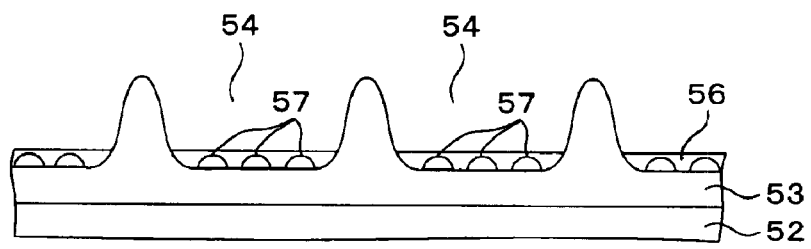

After the first-layer InAs islands 55 are formed in this manner, as shown in FIG. 3G, an i-type GaAs intermediate layer 56 is formed on the overall surface to have a thickness of about 2 to 3 nm such that the InAs islands 55 are covered with the i-type GaAs intermediate layer 56. Accordingly, the InAs islands 55 are surrounded by the GaAs that have a large band gap, so that the quantum dots 57 that confine the carrier three-dimensionally are formed.

In this case, the quantum dots 57 are formed of InAs in the present embodiment. But such quantum dots 57 may be formed of InGaAs, InGaAsP, GaInNAs, or the like.

Figure 3H:
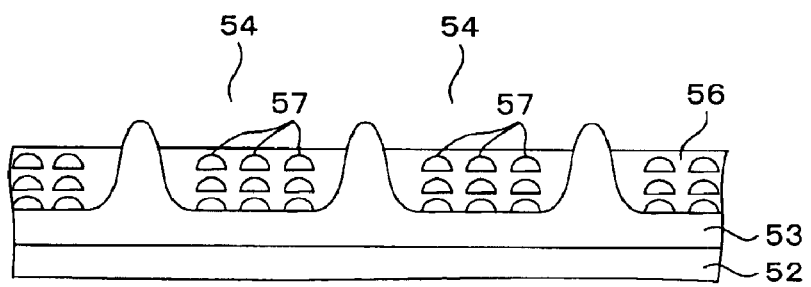

Then, the formation of the InAs islands 55 and the deposition of the i-type GaAs intermediate layer 56 are repeated several times. Thus, as shown in FIG. 3H, the quantum dot structure in which the quantum dots 57 are arranged on the inside of the grooves 54 three-dimensionally is formed.

Figure 3I:
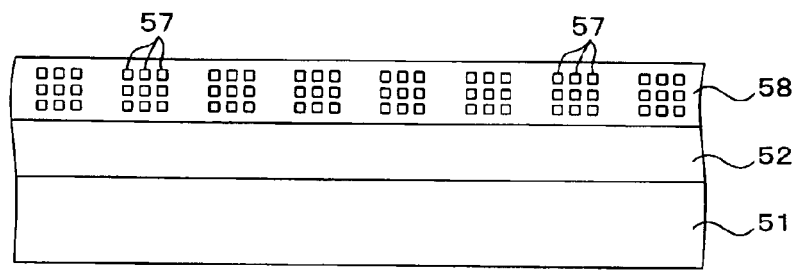

Then, a surface of the intermediate layer 56 is planarized by depositing the i-type GaAs until the grooves 54 are buried. Thus, as shown in FIG. 3I, an i-type GaAs SCH layer (active layer) 58 is formed. An area in which quantum dots 57 are arranged in the three-dimensional direction and an area in which the quantum dots 57 are not formed are provided periodically alternatively in the GaAs SCH layer 58.

Figure 3J:
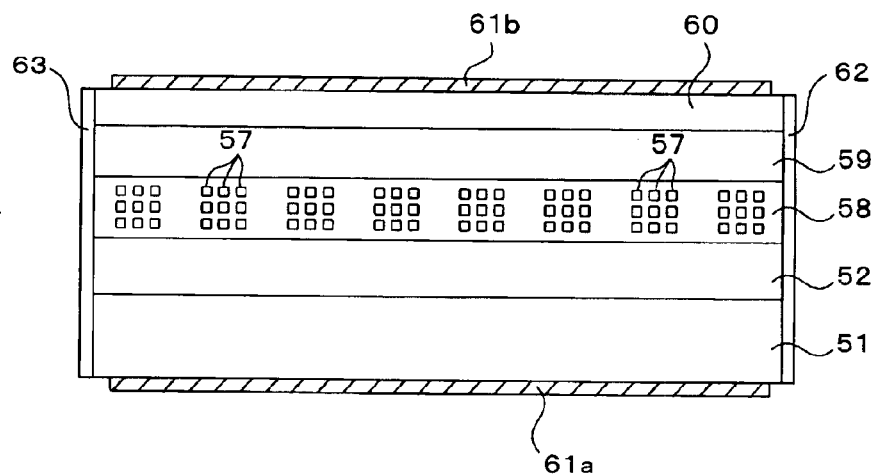

Then, as shown in FIG. 3J, a cladding layer 59 made of p-type $Al_{0.4}Ga_{0.6}As$ is formed on the GaAs SCH layer 58 to have a thickness of about 1400 nm. Then, a p-type GaAs cap layer 60 of about 400 nm thickness is formed on the AlGaAs cladding layer 59. Then, a high reflectance mirror 62 is formed on one end surface side of the GaAs SCH layer 58, and also a low reflectance mirror 63 is formed on the other end surface side of the GaAs SCH layer 58. Then, an electrode 61a is formed on a bottom surface of the substrate 51, and an electrode 61b is formed on the p-type GaAs cap layer 60. As a result, the quantum-dot distributed-feedback type semiconductor laser is completed.

According to the present embodiment, as shown in above FIG. 3E, the In molecules and the As molecules, which come up to the slant surfaces of the convex portions, are moved to the flat surfaces at the bottom portions of the grooves 54 to form the quantum dots. Therefore, the quantum dots can be formed uniformly at a high density rather than the case where the quantum dots are formed on the flat plate-like substrate (see FIG. 1 and FIGS. 2A to 2G). As a result, since the quantum dots exist locally at top or bottom portions of the standing wave at the high density, an effect to increase the gain can be attained. Accordingly, in the semiconductor laser manufactured by the present embodiment, the chirping is hard to occur even when the direct modulation is applied. Thus, such semiconductor laser can be applied to the very high-speed/large-capacity optical fiber communication system.

In this case, the inventors of this application have proposed the semiconductor laser in which concave and convex portions are provided on the semiconductor substrate periodically and then the quantum dots are formed on bottom surfaces (root portions) of the concave portions and top surfaces (peak portions) of the convex portions respectively (Patent Application Publication (KOKAI) 2001-326421). In contrast to this semiconductor laser, the quantum dots are formed only on the bottom portions of the grooves in the semiconductor laser of the present embodiment, and therefore such advantages can be achieved that the density and the uniformity of the quantum dots are improved and the gain can be increased much more.

(Second Embodiment)

Figure 4:
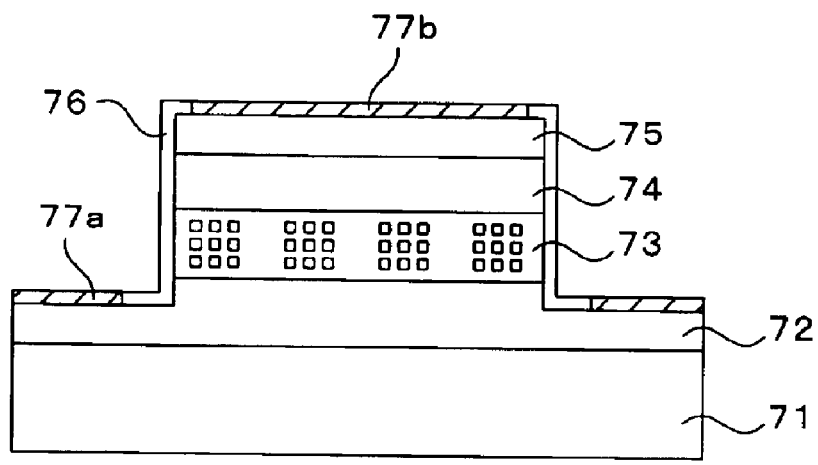
FIG. 4 is a sectional view showing a method of manufacturing a semiconductor laser according to a second embodiment of the present invention.

FIG. 4 is a sectional view showing a method of manufacturing a semiconductor laser according to a second embodiment of the present invention. In this case, the present embodiment shows an example in which the present invention is applied to manufacture of a ridge-mesa type semiconductor laser.

First, an n-type AlGaAs cladding layer 72 is formed on a (100) face of an n-type GaAs semiconductor substrate 71 by using the MBE method, and then an i-type GaAs SCH layer 73 having a periodic structure of the quantum dots therein is formed thereon. The i-type GaAs SCH layer 73 is formed by the same method as the first embodiment (see FIGS. 3C to 3H).

Then, a p-type AlGaAs cladding layer 74 is formed on the i-type GaAs SCH layer 73, and then a p-type GaAs cap layer 75 is formed thereon.

Then, a mask having a predetermined shape is formed on the p-type GaAs cap layer 75. Then, a ridge-mesa structure is formed by etching respective layers up to the middle of a thickness of the n-type AlGaAs cladding layer 72 using the mask. In this case, an n-type GaAs buffer layer may be formed previously between the n-type GaAs semiconductor substrate 71 and the n-type AlGaAs cladding layer 72, and then the etching may be carried out until the GaAs buffer layer is exposed.

Then, an insulating film 76 made of SiN, or the like, for example, is formed on an overall upper surface of the GaAs semiconductor substrate 71. Then, an opening portion from which the n-type AlGaAs cladding layer 72 is exposed and an opening portion from which the p-type GaAs cap layer 75 is exposed are formed by etching selectively the insulating film 76 by virtue of the photolithography method. Then, a metal film is formed on the overall upper surface of the semiconductor substrate 71. Then, an electrode 77a connected to the n-type AlGaAs cladding layer 72 and an electrode 77b connected to the p-type GaAs cap layer 75 are formed by patterning the metal film by virtue of the photolithography method. Accordingly, the ridge-mesa type semiconductor laser is completed.

According to the present embodiment, like the first embodiment, the stripe-like grooves are formed in the i-type GaAs layer, then the flat portions of the terraces are almost eliminated by the heat, and then the InAs quantum dots are formed by the MBE method. As a result, the semiconductor laser in which the quantum dots can be formed uniformly at the high density on the bottom portions of the grooves, which can have the large gain, and in which the chirping is hard to occur even when the direct modulation is applied thereto can be obtained.

(Other Embodiment)

Figure 5:
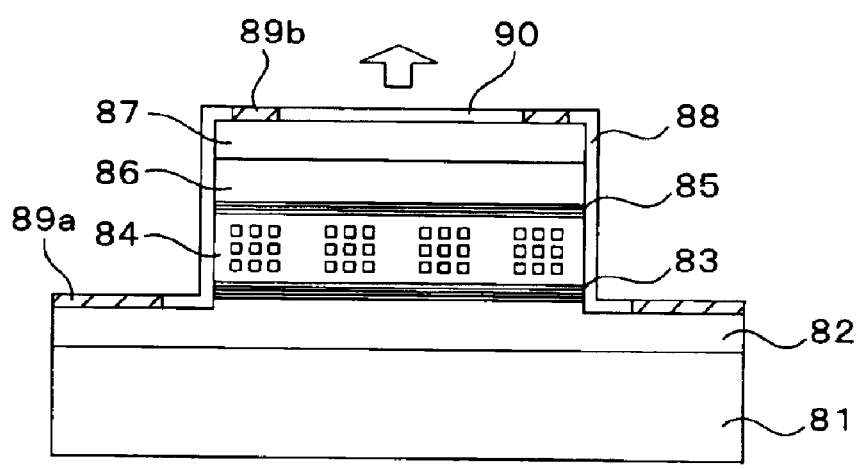
FIG. 5 is a sectional view showing an example of a surface emitting semiconductor laser.

In the above first and second embodiments, the case where the present invention is applied to the manufacture of the edge emitting semiconductor laser is explained. But the present invention can be applied to manufacture of a surface emitting semiconductor laser. FIG. 5 is a sectional view showing an example of the surface emitting semiconductor laser.

First, an n-type AlGaAs cladding layer 82 is formed on an n-type GaAs semiconductor substrate 81. This n-type AlGaAs cladding layer 82 is shaped into the mesa type, and also a mirror layer 83 is formed on the mesa portion of the n-type AlGaAs cladding layer 82. This mirror layer 83 consists of a GaAs layer and an AlGaAs layer, which are laminated alternatively, for example.

Then, an i-type GaAs SCH layer 84 having a periodic structure of the quantum dots is formed on the mirror layer 83. A mirror layer 85 is formed on the i-type GaAs SCH layer 84. This mirror layer 85 also consists of the GaAs layer and the AlGaAs layer, which are laminated alternatively, for example. However, the number of laminated layers of the mirror layer 85 is reduced smaller than that of the mirror layer 83 such that the light that is amplified to some extent can pass through the mirror layer 85.

Then, a p-type AlGaAs cladding layer 86 is formed on the mirror layer 85. Then, a p-type GaAs cap layer 87 is formed on the p-type AlGaAs cladding layer 86.

Upper surfaces or side surfaces of the AlGaAs cladding layer 82, the mirror layer 83, the i-type GaAs SCH layer 84, the mirror layer 85, the p-type AlGaAs cladding layer 86, and the p-type GaAs cap layer 87 are covered with an insulating film 88. One electrode 89a is connected to the AlGaAs cladding layer 82 via an opening portion provided in the insulating film 88, and the other electrode 89b is connected to the p-type GaAs cap layer 87 via an opening portion provided in the insulating film 88 like a ring. Then, a reflection preventing film 90 is formed on the inside of the electrode 89b.

In the surface emitting semiconductor laser constructed in this manner, the i-type GaAs SCH layer is formed by the method explained in the first embodiment. That is, the grooves are formed like the stripe in the i-type GaAs layer, then the flat portions of the terraces are almost eliminated by the heat, and then the InAs quantum dots are formed by the MBE method. In this case, in the surface emitting semiconductor laser, the period of the quantum dots in the vertical direction is set to the same extent as the positive-integral multiple of ½ of the wavelength in the waveguide.

What is claimed is:

1. A method of manufacturing a semiconductor laser comprising the steps of:

forming a semiconductor layer on a substrate;

forming periodic concave and convex portions on the semiconductor layer;

deforming flat surfaces of the convex portions in the semiconductor layer into slant surfaces that are inclined toward bottom portions of the concave portions; and forming an active layer in which quantum dots are arranged three-dimensionally only on insides of the concave portions.

2. A method of manufacturing a semiconductor laser, according to claim 1, wherein the concave portions are formed to have a width that is wider than the convex portions.

3. A method of manufacturing a semiconductor laser, according to claim 1, wherein the concave and convex portions are formed periodically along a light propagation direction at a period that is set to a same extent as a positive-integral multiple of ½ of a wavelength of the quantum dots in the waveguide.

4. A method of manufacturing a semiconductor laser, according to claim 1, wherein the quantum dots are formed in a self-formation manner.

5. A method of manufacturing a semiconductor laser comprising the steps of:

forming a first layer made of a first semiconductor layer on a substrate;

forming periodic stripe-like grooves on the first layer;

deforming flat surfaces of the first layer between the grooves into slant surfaces that are inclined toward bottom portions of the grooves, by heating the first layer together with the substrate; and forming quantum dots only on the bottom portions of the grooves by utilizing a difference between lattice constants, by depositing a second semiconductor on insides of the grooves.

6. A method of manufacturing a semiconductor laser, according to claim 5, wherein deposition of the second semiconductor is executed by a molecular beam epitaxy method.

7. A method of manufacturing a semiconductor laser, according to claim 5, wherein a width of the grooves is set wider than a width of the flat portions between the grooves.

8. A method of manufacturing a semiconductor laser, according to claim 5, wherein the quantum dots are formed on insides of the grooves as a layered-structure.

9. A method of manufacturing a semiconductor laser, according to claim 5, wherein the substrate is formed of any one of a GaAs semiconductor substrate, an InGaAs semiconductor substrate, and an InP semiconductor substrate.

10. A method of manufacturing a semiconductor laser, according to claim 5, wherein the quantum dots are made of any one of InAs, InGaAs, InGaAsP, and GaInNAs.

11. A method of manufacturing a semiconductor laser, according to claim 5, wherein the first layer is made of GaAs.

12. A method of manufacturing a semiconductor laser, according to claim 5, wherein the grooves are formed at a period that is set to a same extent as a positive-integral multiple of ½ of a wavelength in the waveguide.

13. A method of manufacturing a semiconductor laser, according to claim 5, wherein a pitch of the grooves is set such that a wavelength of an output light becomes 1.3 µm.

14. A method of manufacturing a semiconductor laser, according to claim 5, wherein a pitch of the grooves is set such that a wavelength of an output light becomes 1.55 µm.

* * * * *